US006358673B1

(12) United States Patent
Namatsu

(10) Patent No.: US 6,358,673 B1
(45) Date of Patent: Mar. 19, 2002

(54) PATTERN FORMATION METHOD AND APPARATUS

(75) Inventor: Hideo Namatsu, Kanagawa (JP)

(73) Assignee: Nippon Telegraph and Telephone Corporation (JP)

( * ) Notice: Subject to any disclaimer, the term of this patent is extended or adjusted under 35 U.S.C. 154(b) by 0 days.

(21) Appl. No.: 09/390,522

(22) Filed: Sep. 3, 1999

(30) Foreign Application Priority Data

| Sep. 9, 1998 | (JP) | 10-254835 |
| Nov. 4, 1998 | (JP) | 10-312714 |
| Jan. 28, 1999 | (JP) | 11-019596 |

(51) Int. Cl.$^7$ ................................................ G03F 7/40
(52) U.S. Cl. ....................................... 430/311; 430/325
(58) Field of Search ............................... 430/311, 315, 430/324, 325

(56) References Cited

FOREIGN PATENT DOCUMENTS

| JP | 63-179530 | 7/1988 |
| JP | 1-220828 | 9/1989 |
| JP | 3-127832 | 5/1991 |
| JP | 8-250464 | 9/1996 |
| JP | 9-139374 | 5/1997 |
| JP | 10-221502 | 8/1998 |

OTHER PUBLICATIONS

"Dimensional Limitations of Nanolines Resulting from Pattern Distortion Due to Surface Tension of Rinse Water" Applied Physics Letters, vol. 65 May 15, 1995, No. 20, pp. 2655–2657.

"Supercritical Fluid Processing: A New Dry Technique for Photoresist Developing" SPIE vol. 2437 pp. 694–708.

*Primary Examiner*—Kathleen Duda
(74) *Attorney, Agent, or Firm*—Blakely Sokoloff Taylor & Zafman

(57) ABSTRACT

In this invention, resist patterns formed by development are dried using a supercritical fluid such that no moisture enters the patterns.

13 Claims, 11 Drawing Sheets

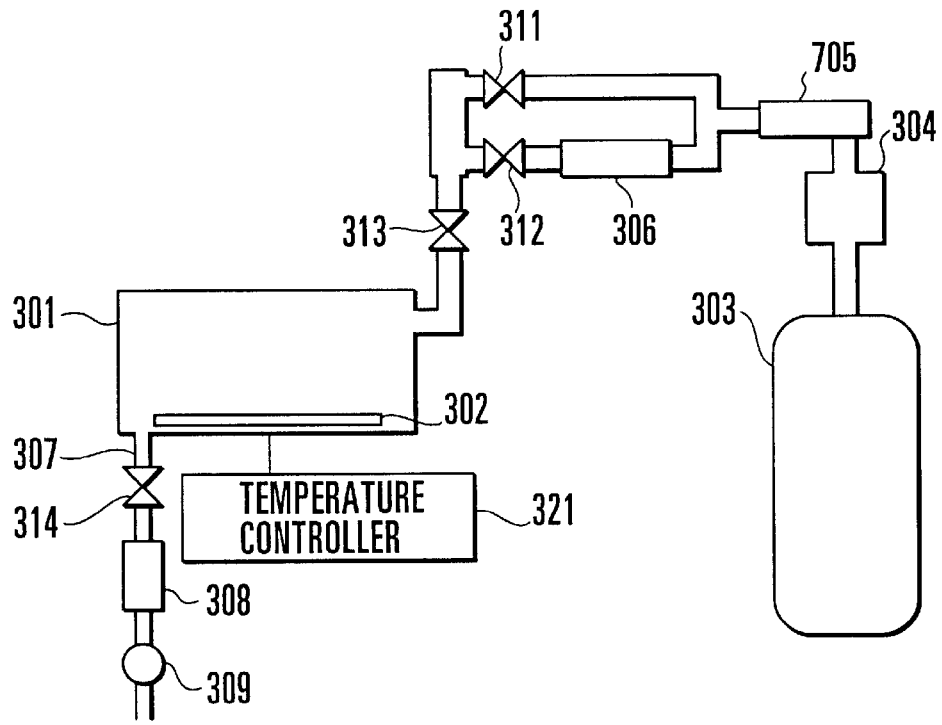
F I G. 7
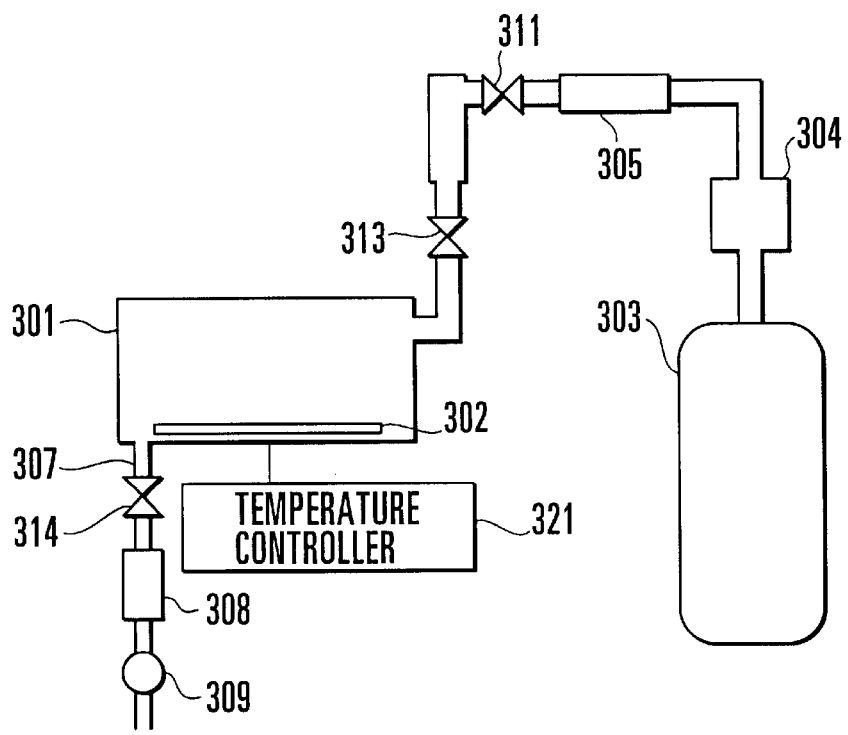
F I G. 8

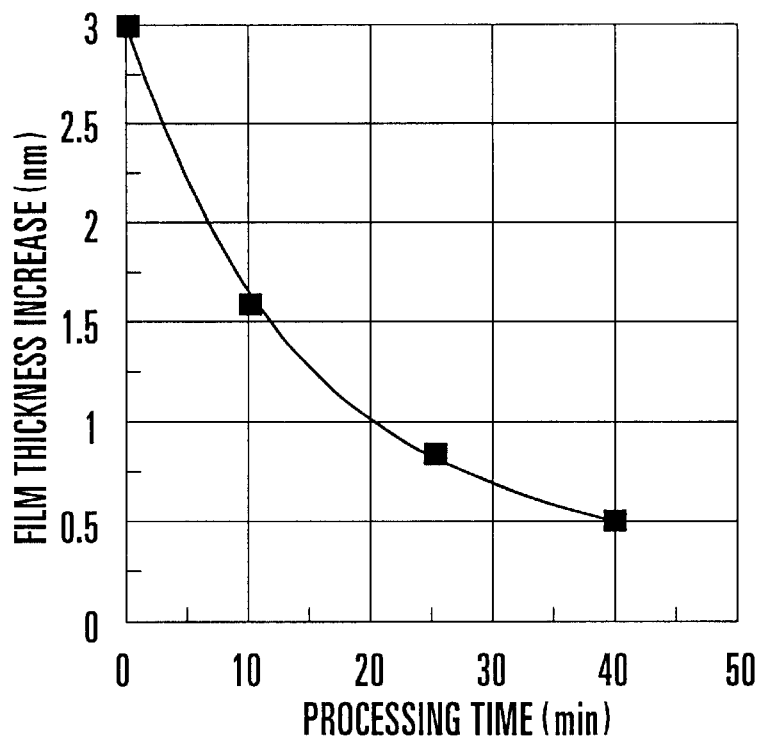
F I G. 13
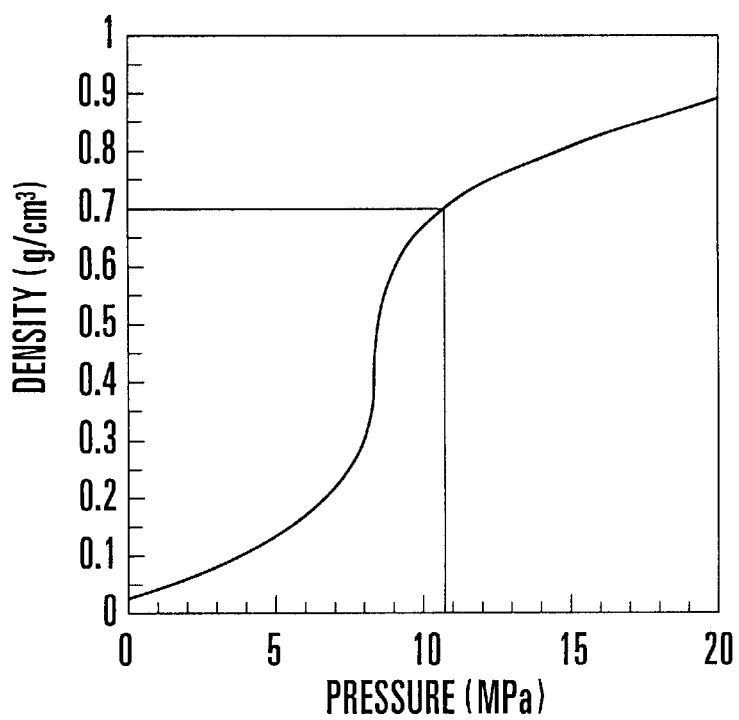
F I G. 14

PATTERN FORMATION METHOD AND APPARATUS

BACKGROUND OF THE INVENTION

The present invention relates to a pattern formation method and apparatus for forming fine patterns used in the fabrication of semiconductor devices and, more particularly, to a method and apparatus for performing development and drying in forming such fine patterns by lithography.

Recently, with increasing scale of MOSLSIs, the chip sizes are increasing, and patterns in LSI fabrication are shrinking; nowadays, patterns having line widths of less than 100 nm are formed. This narrowing of lines results in the formation of patterns having high aspect ratios (height/width).

Also, the formation of fine patterns necessarily increases the aspect ratios of resist patterns as processing masks used in the etching process. These resist patterns can be formed by processing a resist film as an organic material by lithography. That is, when a resist film is exposed to light, the molecular weight or the molecular structure in the exposed region changes to produce a difference in solubility in a developer between this exposed region and the unexposed region. By using this difference patterns can be formed in the resist film by development. If this development continues, even the unexposed region starts dissolving in the developer and the patterns vanish. Therefore, rinsing is performed using a rinse solution to stop the development. Finally, the rinse solution is removed by drying to form resist patterns as processing masks in the resist film.

One major problem encountered when drying is performed in such fine pattern formation is the bending or distortion of patterns 1701 as shown in the sectional view of FIG. 17. That is, such fine resist patterns having a high aspect ratio are formed through rinsing and drying after development. High-aspect-ratio fine patterns are not restricted to resist patterns. For example, substrate patterns with a high aspect ratio are formed through cleaning, rinsing (washing), and drying after a substrate is etched using resist patterns as masks. During the drying after the rinsing process, the patterns 1701 bend toward each other. This phenomenon becomes conspicuous as the aspect ratio of the patterns 1701 increases. As shown in FIG. 18, this phenomenon is caused by a bending force (capillary force) 1810 exerted by a pressure difference between a rinse solution 1802 remaining between patterns 1801 and outside air 1803 when a resist or a substrate is dried. It is reported that this capillary force 1810 depends on the surface tension produced by the liquid/gas interface between the rinse solution 1802 and the patterns 1801 (reference: Applied Physics Letters, Volume 66, pp. 2655–2657, 1995). This capillary force not only bends resist patterns made from an organic material but also has power to distort even strong patterns made from, e.g., silicon, an inorganic material. This makes the aforesaid problem of the surface tension of rinse solution very important. This capillary force problem can be solved by processing using a rinse solution with small surface tension. For example, when water is used as a rinse solution, the surface tension of water is about 72 dyn/cm. However, the surface tension of methanol is about 23 dyn/cm. Therefore, the degree of pattern bending or collapse is suppressed more when water is replaced with ethanol and the ethanol is dried, than when water is directly dried. Furthermore, pattern bending is more effectively suppressed when the rinse solution is replaced with a perfluorocarbon solution and this perfluorocarbon solution is dried. However, as long as these liquids are used, pattern bending cannot be eliminated, although it can be reduced, because all of these liquids have surface tension to some extent.

To solve this problem of pattern bending, it is necessary to use a rinse solution with a zero surface tension or to first replace a rinse solution by a liquid having a zero surface tension and then dry this liquid. A supercritical fluid is an example of the liquid with a zero surface tension. This supercritical fluid is a gas at a temperature and a pressure exceeding the critical temperature and the critical pressure, respectively, and has solubility close to that of a liquid. However, the supercritical fluid has tension and viscosity close to those of a gas and hence can be said to be a liquid keeping a gaseous state. Since this supercritical fluid dose not form any liquid/gas interface, the surface tension is zero. Accordingly, when drying is performed in this supercritical state, there is no surface tension, so no pattern bending takes place. Carbon dioxide is generally used as this supercritical fluid. Since carbon dioxide has low critical points (7.3 MPa, 31° C.) and is chemically stable, it is already used as a critical fluid in biological sample observations.

Conventionally, supercritical drying using the supercritical state of carbon dioxide is done as follows. That is, liquefied carbon dioxide is previously introduced into a predetermined processing vessel to replace a rinse solution by repeatedly discharging the solution. After that, the processing vessel is heated to a temperature and a pressure higher than the critical points, changing the liquefied carbon dioxide in the vessel into supercritical carbon dioxide. Finally, while only this supercritical carbon dioxide adheres to fine patterns, the vessel is evacuated to vaporize the supercritical carbon dioxide and thereby dry the pattern.

Supercritical drying apparatuses marketed or manufactured so far to perform the supercritical drying as described above have the structure as shown in FIG. 19. In this supercritical drying apparatus, a carbon dioxide cylinder 1903 is connected to a reaction chamber 1901 as a processing vessel for holding a substrate 1902 to be processed. A temperature controller 1904 controls the internal temperature of the reaction chamber 1901. In this supercritical drying apparatus, after supercritical carbon dioxide is supplied to replace a rinse solution, this supercritical carbon dioxide is exhausted at a given flow rate by a flow meter 1905. No pressure adjustment is performed during liquefaction and supercritical carbon dioxide processing. The pressure depends upon the amount of liquefied carbon dioxide. Therefore, the pressure after heating is increased to be much higher than the critical pressure by supplying liquefied carbon dioxide as much as possible. Additionally, to supply a sufficient amount of liquefied carbon dioxide, it is necessary to cool the reaction chamber 1901 to the extent that moisture aggregates.

Conventionally, this apparatus is used in resist pattern formation, particularly drying after rinsing, as follows. This drying method will be explained below. First, the substrate 1902 to be processed is rinsed and placed in the reaction chamber 1901. In this state, the rinse solution is still adhered on the substrate 1902. After that, a liquid of carbon dioxide is supplied from the cylinder 1903 into the reaction chamber 1901 heated to a predetermined temperature by the temperature controller 1910, thereby replacing the rinse solution. Next, the interior of the reaction chamber 1901 is set at a temperature and a pressure exceeding the critical points to convert the liquefied carbon dioxide in the reaction chamber 1901 into supercritical carbon dioxide. After that, this carbon dioxide as a supercritical fluid is exhausted from the reaction chamber 1901 to evacuate it, thereby vaporizing the supercritical carbon dioxide and drying resist patterns.

It is also possible to supply dry ice (solid carbon dioxide) into the reaction chamber without using a cylinder. In this method, supercritical carbon dioxide is generated in the reaction chamber by heating the dry ice in the reaction chamber.

Unfortunately, when these conventional supercritical drying apparatuses are used to dry after rinsing in resist pattern formation, resist patterns formed in a dried resist film swell and hence cannot be used as etching masks.

When drying is performed as above, in the reaction chamber the pressure of the supercritical carbon dioxide is about 10 MPa, and is sometimes about 12 MPa. If components other than the carbon dioxide exist around the resist film in the reaction chamber 1901 in this state, pattern swelling of the thin resist film occurs. More specifically, if moisture is condensed on the inner walls of the reaction chamber for forming supercritical carbon dioxide, the water thus formed is incorporated into pressurized supercritical carbon dioxide. When this high-pressure supercritical carbon dioxide diffuses into a thin resist film (organic material), the moisture incorporated into the supercritical carbon dioxide also diffuses into the thin resist film and is held inside it. Since this water contains carbon dioxide, this carbon dioxide dissolved in the water in the thin resist film vaporizes and abruptly increases the volume during drying, i.e., evacuation, thereby swelling the thin resist film.

The present inventors investigated the moisture in resist which causes resist pattern swelling and found that, as shown in FIG. 20, a resist contains a large amount of moisture in supercritical drying using the conventional supercritical drying apparatus. FIG. 20 is a graph showing the results (thermal desorption spectra) of analyses of gases of molecules (water molecules) having a mass number of 18 released from a thin resist film. A curve (a) in FIG. 20 indicates the result before supercritical drying, and a curve (b) indicates the result after supercritical drying using supercritical carbon dioxide at a pressure of 10 MPa. As is apparent from FIG. 20, the thin resist film contains a larger amount of water after supercritical drying than before that. That is, when supercritical drying is done by the conventional method, water is incorporated into a thin resist film.

As described above, when resist patterns are formed using a supercritical fluid by the conventional method, no fine patterns can be accurately formed owing to pattern swelling and the like.

SUMMARY OF THE INVENTION

It is, therefore, a principal object of the present invention to accurately form fine patterns by using a supercritical fluid without any pattern bending or pattern swelling.

To achieve the above object, according to one aspect of the present invention, a resist pattern layer having a predetermined pattern is formed from a resist film of an organic material formed on a substrate. A rinse process is performed by exposing the resist pattern layer to a rinse solution. Before the rinse solution sticking to the resist pattern layer dries out, the resist pattern layer is exposed to supercritical carbon dioxide having a pressure of 8.5 MPa or less. After that, the supercritical carbon dioxide is vaporized by lowering the pressure of the ambient of the substrate.

This arrangement suppresses the entrance of moisture into the resist pattern layer exposed to the supercritical carbon dioxide.

According to another aspect of the present invention, a pattern formation apparatus comprises a closable reaction chamber in which a substrate to be processed is placed, supply means for supplying supercritical carbon dioxide into the reaction chamber, pressure control means for controlling the internal pressure of the reaction chamber, and temperature control means for controlling the internal temperature of the reaction chamber.

With this arrangement, carbon dioxide already made supercritical is supplied into the reaction chamber.

According to still another aspect of the present invention, a resist pattern layer having a predetermined pattern is formed from a resist film of an organic material formed on a substrate. A rinse process is performed by exposing the resist pattern layer to a rinse solution. Before the rinse solution sticking to the resist pattern layer dries out, the resist pattern layer is exposed to a processing fluid not in gaseous state and having a predetermined density higher than in gaseous state or more. This processing fluid is a gas in steady state. Subsequently, the resist pattern layer is exposed to a supercritical fluid. After that, the supercritical fluid is vaporized by lowering the pressure of the ambient of the substrate.

With this arrangement, the rinse solution is replaced by the processing fluid and removed from the resist pattern layer. Also, the processing fluid is replaced by the supercritical fluid and removed from the resist pattern layer.

According to still another aspect of the present invention, a pattern formation apparatus comprises a closable reaction chamber in which a substrate to be processed is placed, first supply means for supplying, into the reaction chamber, a processing fluid not in gaseous state and having a predetermined density higher than in gaseous state or more, second supply means for supplying a supercritical fluid into the reaction chamber, pressure control means for controlling the internal pressure of the reaction chamber, and temperature control means for controlling the internal temperature of the reaction chamber, wherein the processing fluid is a gas in steady state.

With this arrangement, the processing fluid not in gaseous state and having a density higher than in gaseous state and the supercritical fluid are not generated in but supplied into the reaction chamber.

According to still another aspect of the present invention, a resist film of an organic material formed on a substrate is exposed to light. A solvent having developing properties is added to a processing fluid not in gaseous state and having a density higher than in gaseous state, a density at which the solvent uniformly mixes or more is set, and development is performed by exposing the exposed resist film to the processing fluid, thereby forming a resist pattern layer having a predetermined pattern on the substrate. This processing fluid is a gas in steady state. The resist pattern layer is exposed to a supercritical fluid having a pressure equal to or less than the pressure of the processing fluid. After that, the supercritical fluid is vaporized by lowering the pressure of the ambient of the substrate.

With this arrangement, after development is performed by the solvent contained in the processing fluid, this processing fluid is replaced by the supercritical fluid and removed from the resist pattern layer. In this way, development is stopped.

According to still another aspect of the present invention, a resist film of an organic material formed on a substrate is exposed to light. The exposed resist film is developed by exposing it to a polar processing fluid not in gaseous state and having a density higher than in gaseous state, thereby forming a resist pattern layer having a predetermined pattern. This processing fluid is a gas in steady state. The resist pattern is then exposed to a supercritical fluid. After that, the supercritical fluid is vaporized by lowering the pressure of the ambient of the substrate.

With this arrangement, after development is performed using the polar processing fluid, this processing fluid is replaced by the supercritical fluid and removed from the resist pattern layer. In this manner, development is stopped.

BRIEF DESCRIPTION OF THE DRAWINGS

FIG. 7 is a sectional view showing an outline of the arrangement of another pattern formation apparatus according to the second embodiment of the present invention;

FIG. 8 is a sectional view showing an outline of the arrangement of still another pattern formation apparatus according to the second embodiment of the present invention;

FIG. 13 is a graph showing the relationship between the processing time of low-pressure supercritical carbon dioxide and the film thickness increase of a resist film;

FIG. 14 is a graph showing the relationship between the pressure and density of supercritical carbon dioxide;

DESCRIPTION OF THE PREFERRED EMBODIMENTS

Embodiments of the present invention will be described in detail below with reference to the accompanying drawings.

First Embodiment

Figure 1:
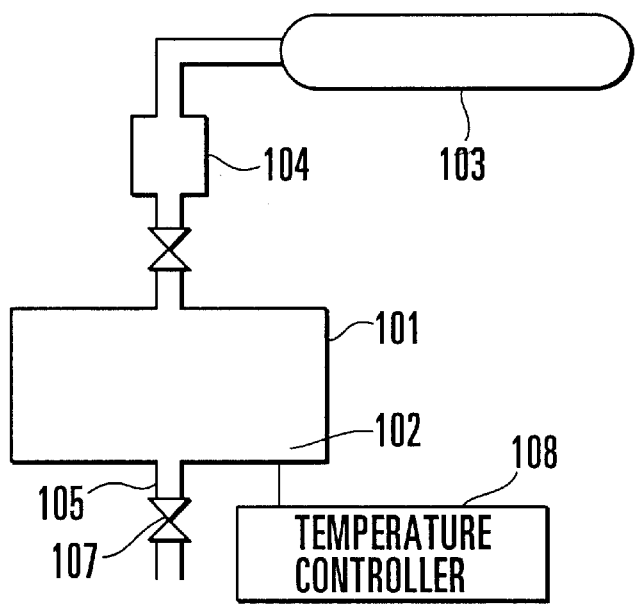
FIG. 1 is a sectional view showing an outline of the arrangement of a pattern formation apparatus according to the first embodiment of the present invention.

The first embodiment of the present invention will be described below. First, a supercritical drying apparatus according to this first embodiment will be explained. As shown in FIG. 1, a substrate 102 is held in a reaction chamber 101. A cylinder 103 of liquefied carbon dioxide is connected to the reaction chamber 101 via a pump unit 104. The reaction chamber 101 also has an exhaust pipe 105. A valve 106 is inserted between the pump unit 104 and the reaction chamber 101. A pressure control valve 107 for automatically controlling the internal pressure of the reaction chamber 101 is attached to the exhaust pipe 105. A temperature controller 108 controls the internal temperature of the reaction chamber 101.

A supercritical drying method according to the first embodiment using this supercritical drying apparatus with the above components will be described below.

First, a thin resist film is formed on the substrate 102 and exposed and developed by the known lithography techniques to form a resist pattern layer having a predetermined pattern shape on the substrate 102. Subsequently, the substrate 102 is rinsed and placed in the reaction chamber 101. After that, the reaction chamber 101 is closed, and liquefied carbon dioxide is supplied from the cylinder 103 into the reaction chamber 101. That is, the pump unit 104 supplies by pressure a given amount of liquefied carbon dioxide, or carbon dioxide previously made supercritical by heating, into the reaction chamber 101. Consequently, the resist pattern layer formation surface of the substrate 102 comes into contact with the liquefied carbon dioxide or supercritical carbon dioxide. This replaces the rinse solution remaining on the substrate 102 with the liquefied carbon dioxide or supercritical carbon dioxide.

The pressure control valve 107 automatically controls the pressure of the carbon dioxide in the reaction chamber 101 to 7.38 to 8.5 MPa, changing the carbon dioxide in the reaction chamber 101 into a supercritical fluid. During this process, the temperature controller 108 controls the temperature of the substrate 102 and the internal temperature of the reaction chamber 101 to 31.1° C. or more. Next, the control condition of the pressure control valve 107 is changed to exhaust the supercritical carbon dioxide from the reaction chamber 101, thereby evacuating the reaction chamber 101, vaporizing the supercritical carbon dioxide, and drying the substrate 102.

In the supercritical drying method using this supercritical drying apparatus, the rinsed substrate 102 is processed by supercritical carbon dioxide as described above. Hence, even if the rinse solution remains between patterns of the resist pattern layer after the substrate 101 is rinsed, this residual rinse solution is replaced with the supercritical carbon dioxide. After the substrate 102 thus comes into contact only with the supercritical carbon dioxide, it is dried by vaporizing this supercritical carbon dioxide having a zero surface tension. Accordingly, no capillary force acts during drying, so no pattern bending of the resist pattern layer occurs.

Additionally, in processing the supercritical carbon dioxide, the pressure of this supercritical carbon dioxide in the reaction chamber 102 is set to 7.38 to 8.5 MPa. Therefore, pattern bending of the resist pattern layer can be suppressed as will be described below. This makes accurate formation of fine patterns feasible.

Figure 2:
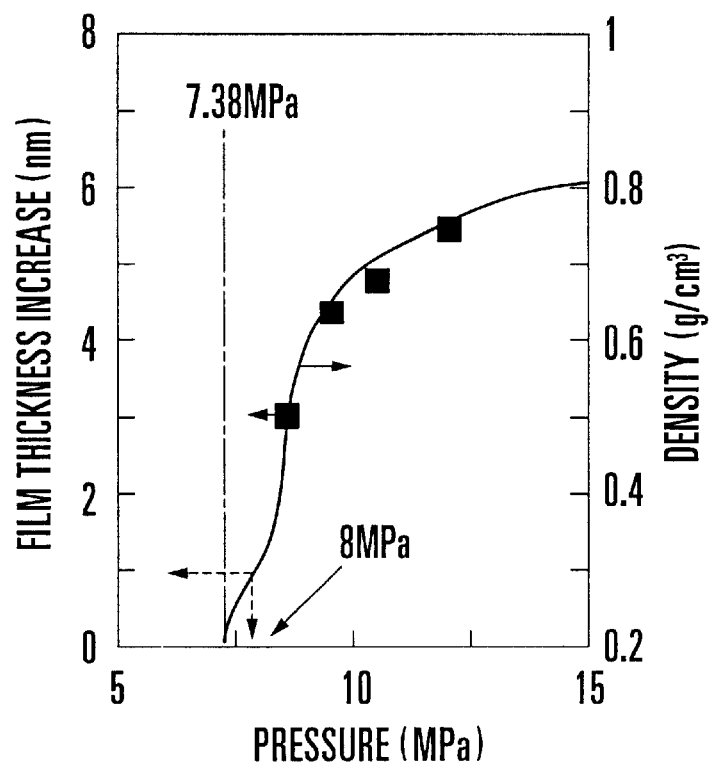
FIG. 2 is a graph showing the relationship between the pressure and density of supercritical carbon dioxide and the film thickness increase of a resist film.

FIG. 2 is a graph showing the relationship (closed squares) between the pressure of supercritical carbon dioxide and the film thickness increase (film swelling) of a thin resist film when drying was done with the supercritical carbon dioxide, and the relationship (solid line) between the pressure and density of the supercritical carbon dioxide during drying.

As shown in FIG. 2, the higher the pressure of the supercritical carbon dioxide during drying, the larger the film swelling of the resist film. Also, the relationship between the pressure and density of the supercritical carbon dioxide is in agreement with the relationship between the pressure of the supercritical carbon dioxide and the film swelling of the resist film. This indicates that the film swelling of the resist film is closely related to the density increase of the supercritical carbon dioxide. That is, when the density of the supercritical carbon dioxide increases, the solubility of water increases to increase the content of water in the supercritical carbon dioxide, and the water content in the supercritical carbon dioxide increases with increasing pressure of the supercritical carbon dioxide. Therefore, when the pressure of the supercritical carbon dioxide increases, water is incorporated into the thin resist film correspondingly. As a consequence, the film swelling of the thin resist film increases.

As can be seen from FIG. 2, when the pressure of the supercritical carbon dioxide drops from 8.5 MPa during drying, the film thickness increase abruptly reduces. Accordingly, the film thickness increase described above can be suppressed by setting the pressure of the supercritical carbon dioxide to 8.5 MPa or less. For example, when the pressure of the supercritical carbon dioxide is set at 8 MPa or less during drying, the film swelling of the thin resist film can be reduced to 1 nm or less. In the above first embodiment, the pressure of the supercritical carbon dioxide in the reaction chamber 101 is set to 7.38 to 8.5 MPa. However, as FIG. 2 shows, the pressure of the supercritical carbon dioxide in the reaction chamber 101 is more preferably set to 7.4 to 7.5 MPa, i.e., set as close to the supercritical point as possible. This is so because in the supercritical state, the closer the pressure to the supercritical point the smaller the film thickness increase. The internal temperature of the reaction chamber need only be 31.1° C. or more.

The method will be described in more detail below.

As an example, a thin film of an electron-beam resist (ZEP-520) was formed on the substrate 102. A desired region was irradiated with an electron beam and developed at room temperature (23° C.) with hexyl acetate to form a resist pattern layer in which predetermined patterns were formed. Subsequently, the substrate 102 was rinsed with ethanol.

Immediately after that, the substrate 102 on which the resist pattern layer was thus formed was held in the reaction chamber 101. Liquefied carbon dioxide from the cylinder 103 was previously heated by a heater (not shown) to 35° C. to thereby form supercritical carbon dioxide, and this supercritical carbon dioxide was supplied by pressure into the reaction chamber 101 by the pump unit 104. At the same time, the internal pressure of the reaction chamber 101 was adjusted to 7.5 MPa by the pressure control valve 107 to change the carbon dioxide in the reaction chamber 101 into a supercritical fluid. Through these steps, the ethanol rinse solution remaining on the substrate 102 was discharged as it was replaced with the supercritical carbon dioxide.

After that, the internal pressure of the reaction chamber 101 was reduced at a rate of 0.4 MPa/min to vaporize the supercritical carbon dioxide and dry the substrate 102.

Consequently, fine patterns of the resist pattern layer were formed in a good condition without any bending or swelling.

As another example, a thin film of an electron-beam resist (polymethylmethacrylate: PMMA) was formed on the substrate 102. A desired region was irradiated with an electron beam and developed at room temperature (23° C.) with hexyl acetate to form a resist pattern layer in which predetermined patterns were formed. Subsequently, the substrate 102 was rinsed with 2-propanol.

Immediately after that, the substrate 102 on which the resist pattern layer was thus formed was held in the reaction chamber 101. Liquefied carbon dioxide from the cylinder 103 was supplied by pressure into the reaction chamber 101 by the pump unit 104. The internal pressure of the reaction chamber 101 was adjusted to 8 MPa by the pressure control valve 107. While the carbon dioxide was supplied at 8 MPa, the temperature of the reaction chamber 101 was set to 31.1° C. or more to change the liquefied carbon dioxide in the reaction chamber 101 into a supercritical fluid. Through these steps, the 2-propanol rinse solution remaining on the substrate 102 was replaced with the liquefied carbon dioxide and exhausted as carbon dioxide in the form of a supercritical fluid.

After that, the internal pressure of the reaction chamber 101 was reduced at a rate of 0.4 MPa/min to vaporize the supercritical carbon dioxide and dry the substrate 102.

Consequently, fine patterns of the resist pattern layer were formed in a good condition without any bending or swelling.

In the above embodiment, ethanol and 2-propanol were used as rinse solutions. However, rinse solutions are not restricted to these materials. Also, although ZEP-520 and PMMA were used as resists, it is also possible to use another electron-beam resist, a photoresist, or an X-ray resist.

Second Embodiment

The second embodiment of the present invention will be described below. In the above first embodiment, drying is performed using a supercritical fluid at a pressure as close to the critical point as possible. However, as will be explained below, a supercritical fluid can also be used at higher pressures.

Figure 3:
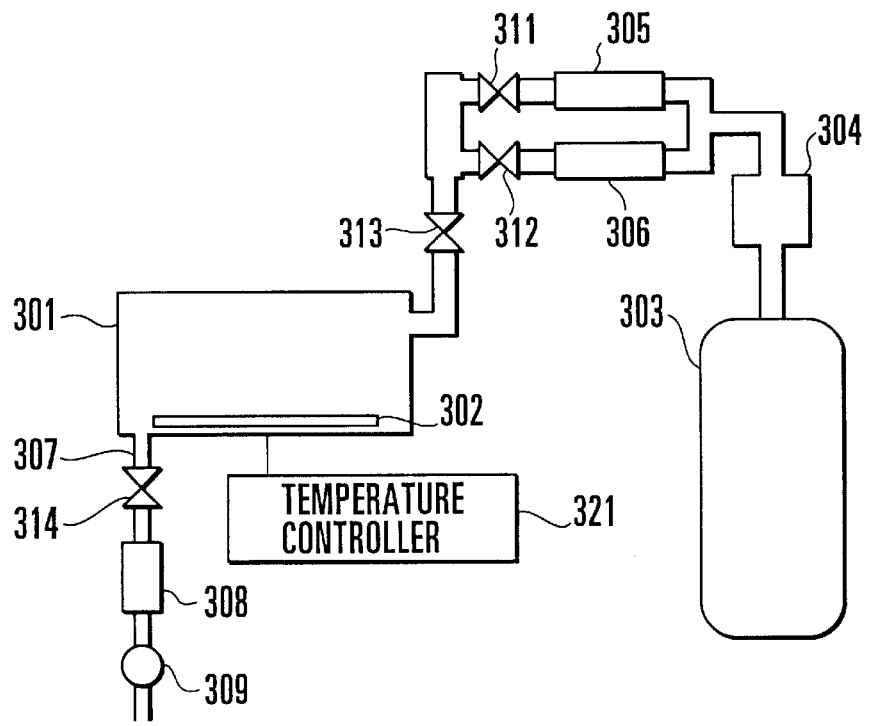
FIG. 3 is a sectional view showing an outline of the arrangement of a pattern formation apparatus according to the second embodiment of the present invention.

A supercritical drying apparatus of this second embodiment will be described below. As shown in FIG. 3, a substrate 302 is held in a reaction chamber 301. A liquefied carbon dioxide cylinder 303 is connected to the reaction chamber 301 via a pump unit 304 and a parallel-connected heating means 305 and cooling means 306. The reaction chamber 301 also has an exhaust pipe 307. A flow meter 308 and a pressure adjuster 309 are connected to the exhaust pipe 307.

Valves 311 and 312 are connected to the exits of the heating means 305 and the cooling means 306, respectively. The reaction chamber 301 has a valve 313 on the cylinder 303 side and a valve 314 on the exhaust pipe 307 side. The reaction chamber 301 also has a temperature controller 321 for controlling the internal temperature of the reaction chamber 301.

A supercritical drying method according to the second embodiment using this supercritical drying apparatus with the above components will be described below.

First, a thin resist film is formed on the substrate 302 and exposed and developed by the known lithography techniques to form a resist pattern layer having a predetermined pattern shape on the substrate 302. Subsequently, the substrate 302 is rinsed and placed in the reaction chamber 301. After that, the reaction chamber 301 is closed, and carbon dioxide from the cylinder 303 is supplied into the reaction chamber 301 after being pressurized by the pump unit 304 and cooled by the cooling means 306. In this manner, the carbon dioxide is liquefied in the reaction chamber 301. The rinse solution on the substrate 302 is replaced with this liquefied carbon dioxide. Thus liquefying the carbon dioxide in the reaction chamber 301 is equivalent to supplying liquefied carbon dioxide into the reaction chamber 301 without cooling it. For example, when the reaction chamber 301 is at about 20° C., carbon dioxide supplied into the reaction chamber 301 liquefies if the internal pressure is set to approximately 6 MPa. In this way, the pressure capable of holding the carbon dioxide liquefied is held by the pressure adjuster 309, and in this state discharge and replacement of the rinse solution are performed. The pressure adjuster 309 is not particularly limited as long as it has an automatic pressure valve.

After the rinse solution is replaced with the liquefied carbon dioxide as above, the carbon dioxide from the cylinder 303 is pressurized by the pump unit 304 and heated by the heating means 305 to generate supercritical carbon dioxide. This supercritical carbon dioxide is supplied into the reaction chamber 301. At the same time, the reaction chamber 301 is heated to 32° C. by the temperature controller 321 so as to be able to hold the supercritical state in the reaction chamber 301. Thus the supercritical carbon dioxide is supplied into and exhausted from the reaction chamber 301, i.e., is allowed to flow through the reaction chamber 301, thereby replacing and exhausting the liquefied carbon dioxide. Finally, the supply of the supercritical carbon dioxide is stopped, and the reaction chamber 301 is evacuated to exhaust the supercritical carbon dioxide and complete the drying process. This evacuation rate need only have a value with which the flow rate of the exhaust fluid, observable by the flow meter 308, is about 0.5 to 2 liters per min.

In this second embodiment as described above, the liquefied carbon dioxide is supplied into the reaction chamber 301 while being pressurized by the pump unit 304, i.e., is already at the critical pressure. Accordingly, the supercritical state can be set only by short-time heating by the heating means 305. Also, since the reaction chamber 301 need not be cooled, adhesion of water caused by condensation is suppressed.

Pattern swelling of a resist pattern layer in supercritical drying and the existence of moisture and the like will be described below.

The problem encountered when the supercritical liquid described in the aforementioned prior art is used arises because components other than the supercritical liquid exist in a processing vessel (reaction chamber) for performing processing. For example, if a rinse solution such as alcohol remains even slightly in the processing vessel, the pressurized supercritical liquid incorporates this rinse solution and diffuses on formed patterns. Consequently, the surface tension of the residual rinse solution acts during drying.

In addition, when the object to be dried is an organic substance such as resist patterns, if water is present as a component other than the supercritical liquid, this water is incorporated into the pressurized supercritical liquid, diffused in a fine film of a resist pattern layer, and held in it. In this case, a gas as the supercritical liquid is also confined together with the water in this resist film. Therefore, when the processing vessel is evacuated to vaporize the supercritical liquid, the gas confined in the resist film vaporizes to greatly increase its volume, resulting in pattern swelling of the resist pattern layer.

Figure 4:
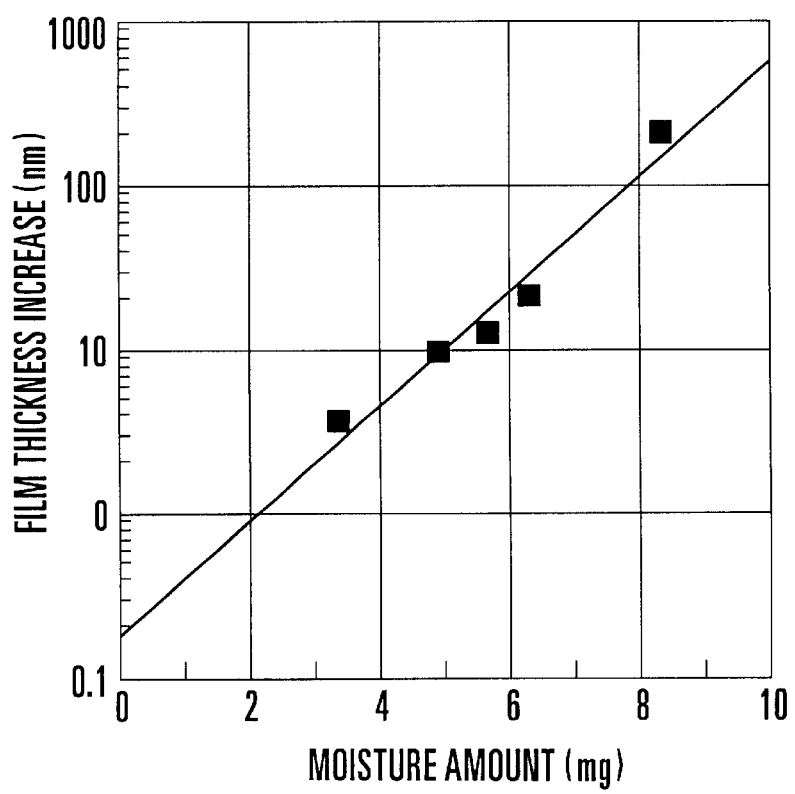
FIG. 4 is a graph showing the relationship between the moisture amount and the film thickness increase of a resist film.

FIG. 4 shows the relationship between the moisture amount in 30 L of carbon dioxide released from inside a processing vessel and the film thickness increase of a resist film, when carbon dioxide was used as a supercritical liquid. As is evident from FIG. 4, as the moisture amount increases, the film thickness of the resist film increases. Since the film thickness increase must be reduced to 1 nm or less, the moisture amount in 30 L of carbon dioxide must be reduced to at least 1 mg or less. Also, the state in which moisture enters a resist when drying is performed by using the supercritical state as in the prior art, as is also shown in FIG. 22, is confirmed by the results of measurements done by thermal desorption spectroscopy (TDS).

To solve these problems, it is only necessary to reduce the amounts of the rinse solution and moisture remaining in the processing vessel, to the extent that no problems arise, before the supercritical liquid is used.

In the conventional supercritical drying apparatus, a substrate to be processed is placed in a reaction chamber (processing vessel) cooled to some extent, and a liquid of carbon dioxide is supplied. This is because if the interior of the reaction chamber is not cooled, carbon dioxide in liquid state cannot be directly supplied from a cylinder. For this reason, the inner walls of the cooled reaction chamber easily adsorb moisture by condensation. So, it is impossible to avoid adsorption of moisture to the inner walls of the reaction chamber.

By contrast, in this second embodiment, carbon dioxide already made supercritical as it is pressurized by the pump unit 304 and heated by the heating means 305 is supplied into the reaction chamber 301. To hold this carbon dioxide supercritical, the interior of the reaction chamber 301 is set at a temperature higher than the critical temperature (31° C.) by the temperature controller 321. Therefore, it is unlikely that the inner walls of the reaction chamber adsorb moisture owing to condensation or the like.

Additionally, the solubility of water in supercritical carbon dioxide is much lower than that in liquefied carbon dioxide. Accordingly, mixing of water inside the reaction chamber 301 can be suppressed by supplying carbon dioxide already made supercritical into the reaction chamber 301, rather than by making liquefied carbon dioxide supercritical in the reaction chamber 301.

In fact, when a thin resist film in which no patterns were formed was processed by supplying carbon dioxide already made supercritical, the film thickness increase of this thin resist film was 1 nm or less, i.e., the film thickness remained almost unchanged.

As supercritical carbon dioxide has low solubility in the rinse solution, if it is simply introduced onto the substrate processed with the rinse solution, it cannot be replaced well and the substrate dries with the rinse solution remaining thereon. Hence, this method cannot solve the problem associated with the surface tension of the rinse solution.

When a liquid having high solubility in both of a rinse solution and a supercritical fluid is used to replace the rinse solution and then this liquid is replaced with the supercritical fluid, processing can be performed without leaving the rinse solution. This liquid having high solubility in both a rinse solution and a supercritical fluid is liquefied carbon dioxide, as explained in the supercritical drying method of this second embodiment.

In the second embodiment as described above, liquefied carbon dioxide is supplied into the reaction chamber 301 to replace/exhaust a rinse solution, and then supercritical carbon dioxide is supplied into the reaction chamber 301 to replace/exhaust the liquefied carbon dioxide. Consequently, adsorption of moisture caused by condensation or the like is suppressed in the reaction chamber 301. Also, most moisture in the reaction chamber 301 is replaced/exhausted by the liquefied carbon dioxide processing. Since the substrate is dried using the supercritical carbon dioxide with almost no moisture present as described above, this second embodiment can suppress pattern swelling of a resist pattern layer.

In the second embodiment, it is necessary to almost completely replace/exhaust the liquefied carbon dioxide by the supply of the supercritical carbon dioxide such that no liquefied carbon dioxide remains. This is because if the reaction chamber is evacuated to dry with liquefied carbon dioxide remaining after the supply of the supercritical carbon dioxide, moisture dissolved in the residual liquefied carbon dioxide brings about pattern swelling of a pattern resist layer. Note that the pressure when the supercritical carbon dioxide is supplied can be any pressure within the range in which the supercritical state is obtained. However, the pressure is preferably adjusted to be as close to the critical point as possible.

Figure 5:
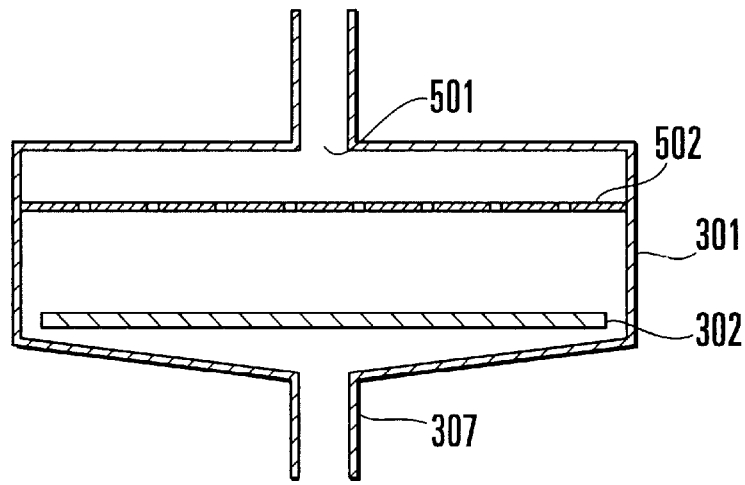
FIG. 5 is a sectional view showing an outline of the arrangement of a portion of the pattern formation apparatus according to the second embodiment of the present invention.
Figure 6:
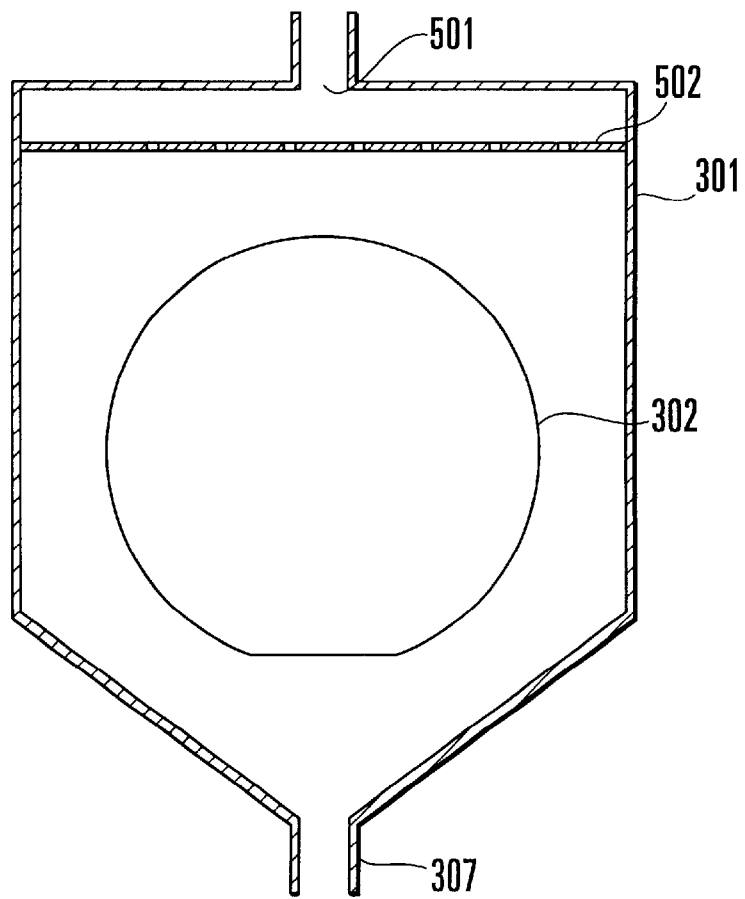
FIG. 6 is a sectional view showing an outline of the arrangement of a portion of the pattern formation apparatus according to the second embodiment of the present invention.

To efficiently replace/exhaust liquefied carbon dioxide in which moisture is dissolved by supercritical carbon dioxide, it is possible to use a structure which allows these liquid and fluid to flow from the upper portion to the lower portion as shown in FIG. 5 or 6.

Referring to FIG. 5, for example, a supply hole 501 is formed in the center of the upper surface of the reaction chamber 301. Also, the exhaust pipe 307 is connected to the center of a funnel-shaped bottom surface of the reaction chamber 301. A perforated plate 502 having a plurality of holes is placed immediately below the supply hole 501 in the reaction chamber 301. This allows liquefied carbon dioxide or the like, supplied into the reaction chamber 301 through the supply hole 501, to reach the substrate 302 after passing through many holes scattered in the entire area of the perforated plate 502. As a consequence, a liquid or fluid such as liquefied carbon dioxide can be supplied more uniformly to the entire surface of the substrate 302.

In FIG. 5, the surface of the substrate 302 is set to be perpendicular to the flowing direction of a liquid or fluid. However, as shown in FIG. 6, this surface of the substrate 302 can also be set to be parallel to the flowing direction of a liquid or fluid. If this is the case, even when a plurality of substrates 302 are held in the reaction chamber 301, a liquid or fluid uniformly comes in contact with the surfaces of these substrates 302.

In the above second embodiment, as shown in FIG. 3, the cooling means 306 is used to efficiently supply liquefied carbon dioxide into the reaction chamber 301, and the heating means 305 is used to efficiently supply supercritical carbon dioxide. However, the present invention is not limited to this arrangement.

As depicted in FIG. 7, supercritical carbon dioxide processed by a heating means 705 can be cooled into liquefied carbon dioxide by the cooling means 306. Note that the same reference numerals as in FIG. 3 denote the same parts in FIG. 7.

As shown in FIG. 8, to supply liquefied carbon dioxide to the reaction chamber 301, this liquefied carbon dioxide is supplied from the cylinder 303 to the reaction chamber 301 while being simply pressurized by the pump unit 304. To supply supercritical carbon dioxide to the reaction chamber 301, the heating means 305 heats the liquefied carbon dioxide so that the liquefied carbon dioxide can be easily made supercritical, and this liquefied carbon dioxide is supplied to the reaction chamber 301. The pressure adjuster 308 adjusts the internal pressure of the reaction chamber 301 to turn the supplied liquefied carbon dioxide into supercritical carbon dioxide. In the apparatus shown in FIG. 8, it is also possible to supply carbon dioxide made supercritical by heating by the heating means 305 and turn this supplied supercritical carbon dioxide into liquefied carbon dioxide by allowing the temperature controller 321 to control the internal temperature of the reaction chamber 301. In this case, an effect similar to that described above can be obtained although the liquefaction takes time. Note that the same numerals as in FIG. 3 denote the same parts in FIG. 8.

To further reduce water adsorbed to the reaction chamber 301, development or rinsing need only be performed in the reaction chamber 301. The following method is particularly effective when an organic solvent such as alcohol is used as a rinse solution.

Figure 9:
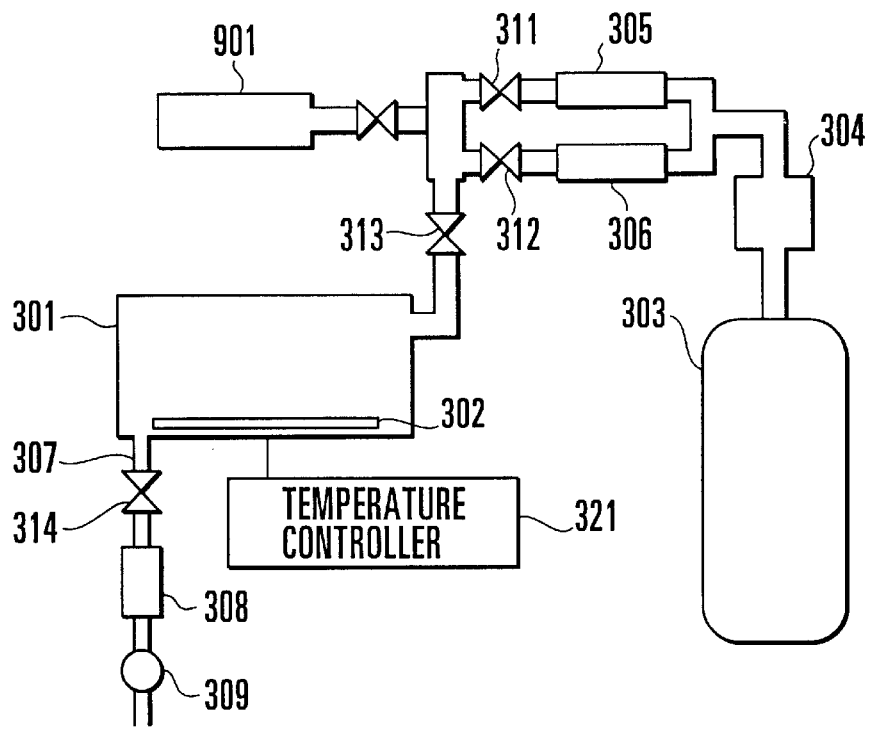
FIG. 9 is a sectional view showing an outline of the arrangement of still another pattern formation apparatus according to the second embodiment of the present invention.
Figure 10:
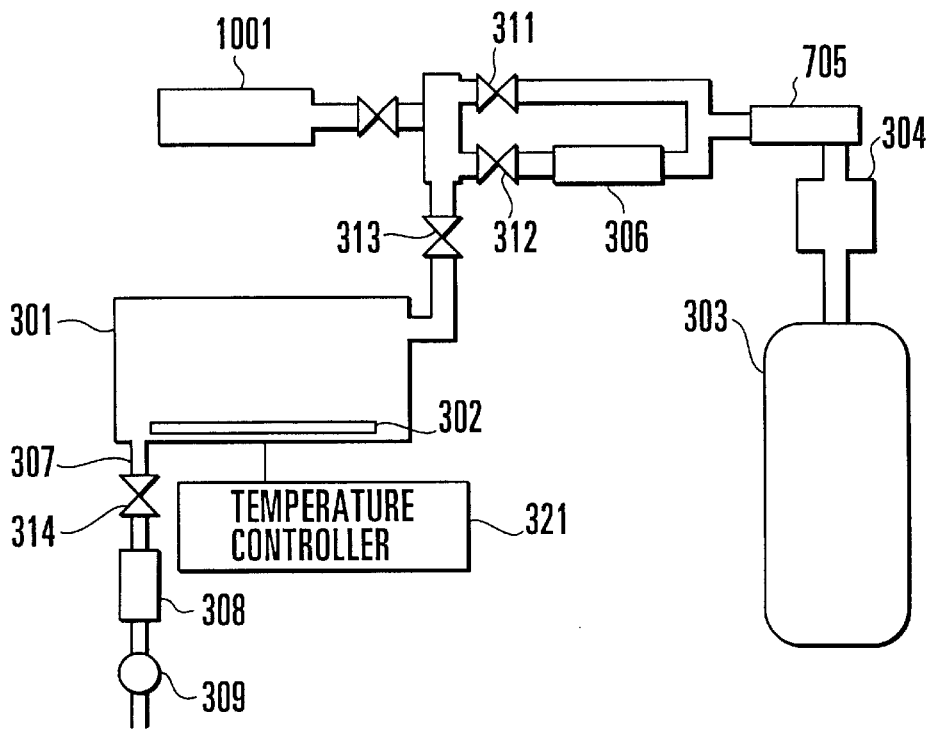
FIG. 10 is a sectional view showing an outline of the arrangement of still another pattern formation apparatus according to the second embodiment of the present invention.
Figure 11:
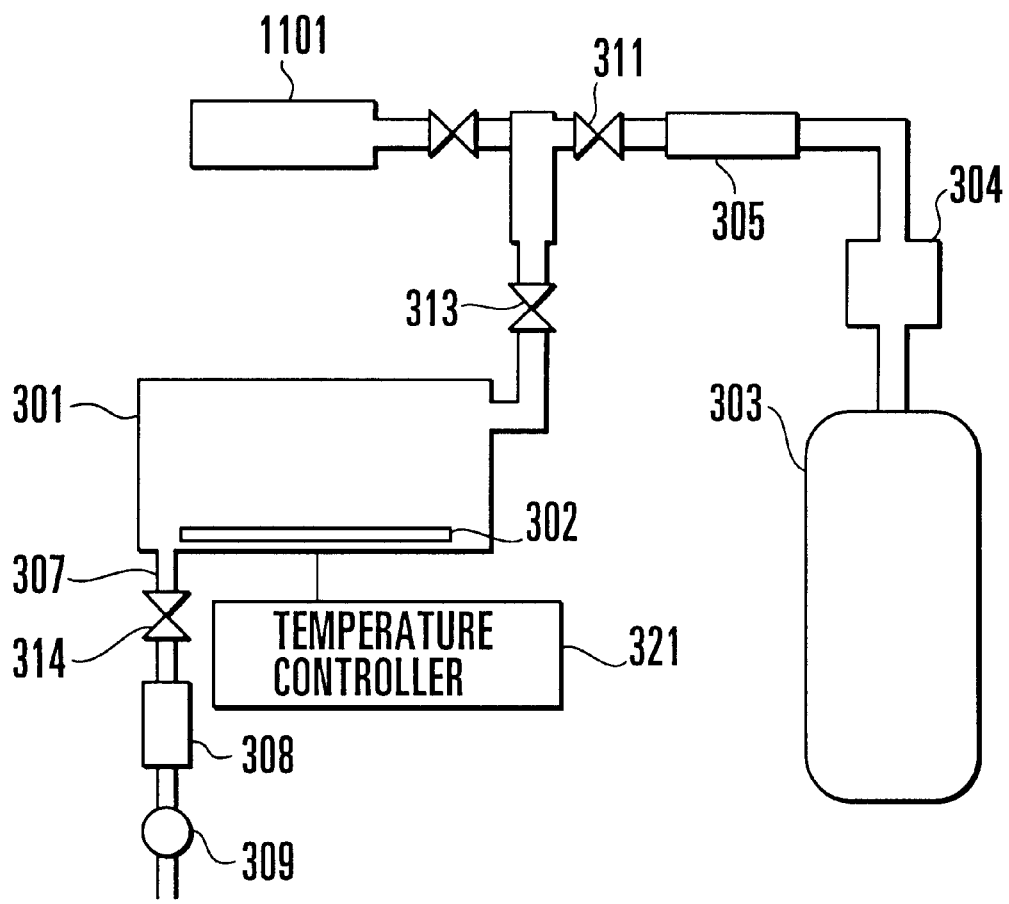
FIG. 11 is a sectional view showing an outline of the arrangement of still another pattern formation apparatus according to the second embodiment of the present invention.

In this method, any of supercritical drying apparatuses shown in FIGS. 9, 10, and 11 is used. The supercritical drying apparatus shown in FIG. 9 includes a chemical supply means 901 in addition to the components of the supercritical drying apparatus illustrated in FIG. 3. This chemical supply means 901 supplies a developer, a rinse solution, and the like into the reaction chamber 301. Analogously, the supercritical drying apparatus shown in FIG. 10 includes a chemical supply means 1001 in addition to the components of the supercritical drying apparatus shown in FIG. 7. Also, the supercritical drying apparatus depicted in FIG. 11 includes a chemical supply means 1101 in addition to the components of the supercritical drying apparatus shown in FIG. 8.

In any of these supercritical drying apparatuses illustrated in FIGS. 9 to 11, a latent image is formed in a resist film on the substrate 302 by exposure. This substrate 302 is held in the reaction chamber 301. The chemical supply means 901 supplies a developer into the reaction chamber 301 to develop the resist film on the substrate 302 in the reaction chamber 301. After the developer is exhausted from the exhaust pipe 307, the chemical supply means 901 supplies a rinse solution into the reaction chamber 301 to rinse the developed substrate 302. After this rinse solution is exhausted from the exhaust pipe 307, the substrate 302 is dried by liquefied carbon dioxide and supercritical carbon dioxide as described above.

In the above method, even if moisture adheres to the inner walls of the reaction chamber 301, this moisture dissolves in the rinse solution and is exhausted together with the rinse solution. Accordingly, almost no moisture is present in the reaction chamber when the liquefied carbon dioxide processing is performed.

Also, when development, rinsing, and drying are performed in the same reaction chamber 301 as described above, it is possible to avoid the problem that the rinse solution dries while a substrate to be processed is transported into the reaction chamber 301 after the rinse process. Note that each of the chemical supply means 901, 1001, and 1101 can supply a plurality of chemicals, or a plurality of chemical supply means can be prepared to supply different chemicals such as a developer and a rinse solution.

Additionally, adsorption of moisture can be suppressed by coating the inner walls of the reaction chamber 301 with a fluorocarbon resin. When neither liquefied carbon dioxide nor supercritical carbon dioxide is supplied, entrance of moisture into the reaction chamber 301 can be prevented by supplying dried nitrogen gas or the like into the reaction chamber 301. This effectively suppresses moisture adsorption in the reaction chamber 301.

Practical examples of this second embodiment will be described below.

In the first example, the supercritical drying apparatus of FIG. 9 was used to form a resist pattern layer using ZEP-520 as an electron-beam resist.

First, a ZEP-520 coating film was formed on a predetermined substrate 302 and exposed into a desired pattern by an electron beam to form a latent image. The exposed substrate 302 was placed in the reaction chamber 301, and the reaction chamber 302 was closed. At room temperature (23° C.), the film was developed by supplying xylene from the chemical supply means 901 into the reaction chamber 301. Consequently, the exposed latent image was patterned to form a resist pattern layer having fine patterns on the substrate 302. After the xylene in the reaction chamber 301 was exhausted through the exhaust pipe 305, the resist pattern layer was rinsed by supplying 2-propanol from the chemical supply means 901 into the reaction chamber 301. With the reaction chamber 301 filled with this 2-propanol as a rinse solution, liquefied carbon dioxide was supplied into the reaction chamber 301 to replace/exhaust the rinse solution. More specifically, carbon dioxide from the cylinder 303 was pressurized by the pump 304 and supplied through the cooling means 306 for cooling to 10° C. At the same time, the exhaust amount from the reaction chamber 301 was adjusted by the pressure adjuster 309 attached to the exhaust pipe 305, setting the internal pressure of the reaction chamber 301 to 7.5 MPa. In this manner, the liquefied carbon dioxide was supplied into the reaction chamber 301.

As described above, the liquefied carbon dioxide was supplied into the reaction chamber 301 and exhausted from the exhaust pipe 305 to well replace/exhaust the 2-propanol as a rinse solution. After that, supercritical carbon dioxide was supplied into the reaction chamber 301 to replace and exhaust the liquefied carbon dioxide in the reaction chamber 301. That is, carbon dioxide from the cylinder 303 is pressurized by the pump 304 and supplied while being heated by the heater 305. At the same time, the exhaust amount from the reaction chamber 301 was adjusted by the pressure adjuster 309 attached to the exhaust pipe 305, setting the internal pressure of the reaction chamber 301 to 7.5 MPa. In addition, the internal temperature of the reaction chamber 301 was set at 35° C. by the temperature controller 321. This allows the supplied supercritical carbon dioxide to stay supercritical in the reaction chamber.

After the liquefied carbon dioxide in the reaction chamber 301 is completely replaced/exhausted as described above, the internal pressure of the reaction chamber 301 was gradually lowered to vaporize the supercritical carbon dioxide and dry the substrate 302 on which the resist pattern layer was formed. More specifically, while the internal temperature of the reaction chamber 301 was held at 35° C. by the temperature controller 321, the internal pressure of the reaction chamber 301 was gradually lowered by changing the control by the pressure adjuster 309 such that the carbon dioxide exhaust amount from the exhaust pipe 305 was 0.5 liter per min.

As a consequence, a good resist pattern layer was formed on the substrate 302 without any pattern bending or pattern swelling.

Supercritical drying according to the second embodiment can also be used to form fine patterns made from an inorganic substance.

The formation of fine patterns made from an inorganic substance will be described below. A resist pattern layer formed by the known lithography technique was used as a mask to etch a silicon substrate 302 by using an aqueous potassium hydroxide solution as an etching solution. The etched substrate 302 was washed with water and, before being dried, placed in the reaction chamber 301 filled with ethanol, and the reaction chamber 301 was closed.

Next, the temperature of the reaction chamber 301 was kept at 23° C., and carbon dioxide was supplied as liquefied carbon dioxide to exhaust the ethanol. After that, supercritical carbon dioxide was supplied to well replace the liquefied carbon dioxide. At the same time, the pressure was set at 8 MPa and the temperature was raised to 35° C. to form a complete supercritical state. After that, while the temperature was held at 35° C., the supercritical carbon dioxide was released at a rate of 1 liter/min to complete drying of the substrate 302 in the reaction chamber 301. As a consequence, good fine patterns having no pattern bending were formed on the substrate 302.

Third Embodiment

The third embodiment of the present invention will be described below.

In the above first and second embodiments, supercritical carbon dioxide is used in drying after development and rinsing. However, supercritical carbon dioxide can also be used in development. Conventionally, techniques using supercritical fluids in development have been developed. However, supercritical fluids such as carbon dioxide hardly dissolve normally used resist films and hence cannot be directly used as developers. Therefore, improvements have been conventionally made to make resist development possible by addition of a solvent to a supercritical fluid. Unfortunately, when a solvent is simply added to a supercritical fluid, the solvent merely disperses in the form of droplets, so uniform development is impossible. When a high-pressure supercritical fluid is used, the solvent can be homogeneously added, and this makes uniform development feasible. However, even when development is done by using this high-pressure supercritical fluid, film swelling occurs if moisture containing the supercritical fluid enters the formed patterns.

In this third embodiment, therefore, fine patterns were formed without any film swelling or pattern bending by performing development and drying as follows.

Figure 12:
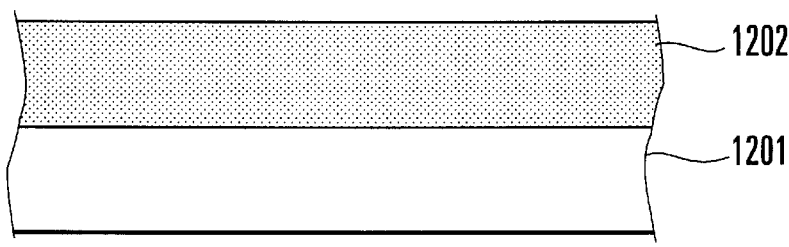
FIGS. 12A to 12E are views for explaining the steps of a pattern formation method according to the third embodiment of the present invention.
Figure 12:
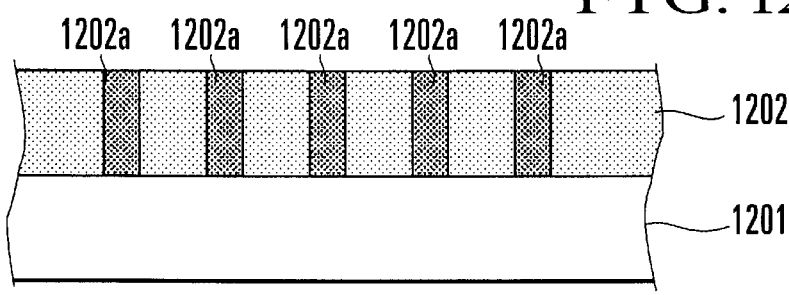
Figure 12:
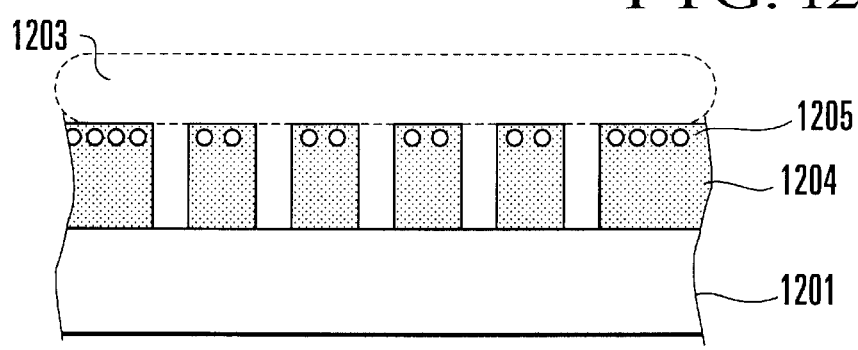
Figure 12:
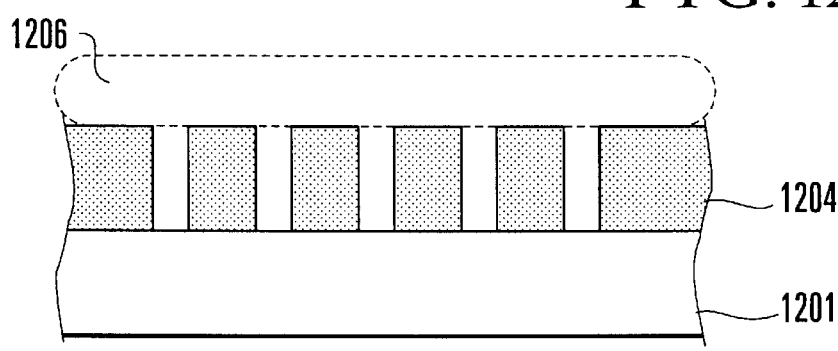
Figure 12:
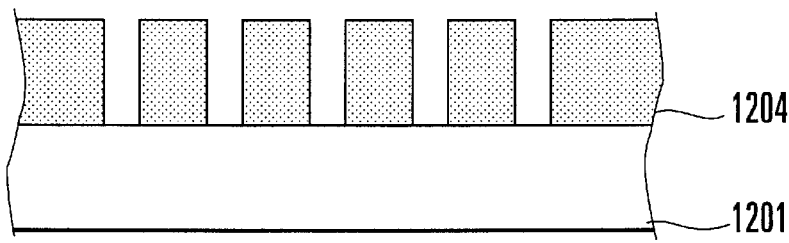

First, as shown in FIG. 12-A, a resist film 1202 about 100 nm thick made from polymethylmethacrylate or ZEP-520 was formed on a substrate 1201.

Next, as shown in FIG. 12-B, desired patterns having a line width of 100 nm or less were formed by exposure in this resist film 1202 to form a latent image 1202a.

As depicted in FIG. 12-C, the patterns were developed using high-pressure supercritical carbon dioxide 1203, to which a dissolving assistant such as ketone or alcohol was added and which had a pressure higher than the supercritical pressure, thereby forming a resist pattern layer 1204 on the substrate 1201. For example, this is done by holding a substrate 302 on which the latent image was formed in a reaction chamber 301 of the supercritical drying apparatus shown in FIG. 9, supplying supercritical carbon dioxide at high pressure into the reaction chamber 301, and adding the dissolving assistant, pressurized by a chemical supply means 901, into this supercritical carbon dioxide being supplied. In this case, the chemical supply means 901 must have a function of supplying the dissolving assistant while pressurizing it.

As this dissolving assistant, methylisobutylketone can be mixed at a ratio of methylisobutylketone:high-pressure supercritical carbon dioxide=5:100 (volume ratio). Instead of high-pressure supercritical carbon dioxide, liquefied carbon dioxide is also usable. If this is the case, methylisobutylketone is mixed at a ratio of methylisobutylketone:liquefied carbon dioxide=5:100 (volume ratio). When liquefied carbon dioxide is used, ZEP-520 is developed for about 20 min by setting the internal pressure of the reaction chamber to about 14 MPa and the internal temperature to 35° C. Likewise, methylmethacrylate is developed for about 5 min by setting the internal pressure of the reaction chamber to about 12 MPa and the internal temperature to 23° C.

By developing using high-pressure supercritical carbon dioxide or liquefied carbon dioxide in this way, as shown in FIG. 12-C, moisture 1205 in which supercritical carbon dioxide and carbon dioxide are dissolved is incorporated into the resist pattern layer 1204.

Next, as depicted in FIG. 12-D, the substrate 1201 is rinsed as it is exposed to low-pressure supercritical carbon dioxide 1206 having a pressure near the supercritical point, thereby efficiently stopping the development. That is, the high-pressure supercritical carbon dioxide is replaced with/exhausted by the low-pressure supercritical carbon dioxide. At the same time, the moisture 1205 incorporated into the resist pattern layer 1204 shown in FIG. 12-C is expelled by the processing using the low-pressure supercritical carbon dioxide. As a consequence, the moisture is removed from the resist pattern layer 1204. This rinse process is done for about 30 min by holding the reaction chamber internal temperature at 35° C., setting the reaction chamber internal pressure to 7.5 MPa, and supplying only supercritical carbon dioxide as a pressurized fluid.

The low-pressure supercritical carbon dioxide 1206 is released from the reaction chamber to lower the ambient pressure of the substrate 1201. Consequently, as shown in FIG. 12-E, the substrate 1201 on which the resist pattern layer 1204 is formed is dried without any pattern bending or swelling of the resist pattern layer 1204. For example, this release of the low-pressure supercritical carbon dioxide 1206 is performed at 1 liter/min while the reaction chamber internal temperature is held at 35° C.

In the pattern formation method explained above, the pattern is developed by using a high-pressure supercritical fluid to which a dissolving assistant is added. Therefore, when compared with the case where the pattern is developed simply using a supercritical fluid, the dissolving rate during development can be increased. Also, compared with development using a common developer, the amount of a chemical used can be reduced.

Also, a high-pressure supercritical fluid is used, so development progresses in a high-density state. This prevents the added dissolving assistant from dispersing in the form of droplets and thereby allows homogeneous addition of the dissolving assistant. Consequently, development can be uniformly performed.

After this development, the substrate is rinsed using a low-pressure supercritical fluid whose pressure is close to the critical point. Hence, moisture and the like incorporated into the resist pattern layer by development using the high-pressure supercritical fluid can be removed. This suppresses pattern swelling during drying. Also, rinsing is naturally done using a supercritical fluid with a zero surface tension, so no pattern bending occurs. From the foregoing, this third embodiment can form good nano-order patterns.

Development can also be performed using liquefied carbon dioxide to which the dissolving assistant is added, instead of the high-pressure supercritical carbon dioxide to which the dissolving assistant is added. If this is the case, rinsing and drying are performed using supercritical carbon dioxide subsequently to the development. When the processes are performed in this way, however, the processing temperature in the rinsing process must be changed from that in the developing process.

When development is performed using this liquefied carbon dioxide, it is possible to mix the dissolving assistant more easily and add the dissolving assistant to the liquefied carbon dioxide more homogeneously than when supercritical carbon dioxide is used. This allows more uniform development.

According to the experiments by the present inventors, the homogeneity of addition of the dissolving assistant to carbon dioxide changes as follows in accordance with the density of the carbon dioxide.

In the case of supercritical carbon dioxide at a temperature of 35° C., the homogeneity of dissolving assistant addition was good both when the density was 0.85 and 0.75 $g/cm^3$. By contrast, the homogeneity of dissolving assistant addition was slightly poor when the density was 0.70 $g/cm^3$, and was poor when the density was 0.60 $g/cm^3$.

In the case of liquefied carbon dioxide at a temperature of 25° C., the homogeneity of dissolving assistant addition was good both when the density was 0.85 and 0.80 $g/cm^3$. By contrast, the homogeneity of dissolving assistant addition was poor when the density was 0.70 $g/cm^3$.

As these experimental results show, regardless of whether supercritical carbon dioxide or liquefied carbon dioxide is used in development, a density of at least 0.7 $g/cm^3$ or more is necessary to homogeneously add the dissolving assistant. The density of supercritical carbon dioxide or liquefied carbon dioxide is preferably 0.75 $g/cm^3$ or more and, more preferably, 0.8 $g/cm^3$ or more.

To raise the density of supercritical carbon dioxide to 0.7 $g/cm^3$ or more, it is necessary to set the temperature and pressure of the supercritical carbon dioxide to 31° C. and 8.5 MPa, respectively. If the temperature is higher, the carbon dioxide cannot be maintained supercritical without raising the pressure. To set the density of supercritical carbon dioxide or liquefied carbon dioxide to about 0.8 $g/cm^3$, the pressure must be 12 MPa or more for supercritical carbon dioxide and 10 MPa or more for liquefied carbon dioxide.

In this third embodiment, the substrate is finally dried after the supercritical carbon dioxide processing. As shown in FIG. 13, as the time of this supercritical carbon dioxide processing prolongs, the film swelling suppressing effect enhances. FIG. 13 shows the correlation between the processing time and the film thickness increase when a resist film processed with 8.5-MPa high-pressure supercritical carbon dioxide was successively processed with 7.5-MPa low-pressure supercritical carbon dioxide. As shown in FIG. 13, the film thickness increase of the resist film reduced as the time of processing using the low-pressure supercritical carbon dioxide whose temperature was close to the critical point prolonged. This indicates that processing using low-pressure supercritical carbon dioxide having low density and not containing moisture has an effect of expelling moisture entering the resist film. This phenomenon occurs regardless of the pressure of carbon dioxide used in the initial processing. This obviously demonstrates that, as shown in FIG. 12-D, the rinse process using the low-pressure supercritical carbon dioxide 1206 can expel moisture from the resist pattern layer 1204.

Fourth Embodiment

The fourth embodiment of the present invention will be described below.

Supercritical carbon dioxide is easy to use because its critical pressure is low, so carbon dioxide is used as a supercritical fluid in most instances. However, supercritical carbon dioxide has low density and low polarity and hence has low compatibility with alcohol, particularly alcohol containing water, used as a developer or a rinse solution. Therefore, it is not easy to rapidly replace a rinse solution containing alcohol with supercritical carbon dioxide.

This problem of density, however, can be solved by raising pressure. FIG. 14 shows the relationship between the pressure and the density ($\rho$) of supercritical carbon dioxide. As shown in FIG. 14, the density can be increased with the pressure.

On the other hand, if the density of supercritical carbon dioxide is 0.7 g/cm$^3$ or more, preferably, 0.75 g/cm$^3$ or more, satisfactory compatibility can be attained between the supercritical carbon dioxide and alcohol. Accordingly, a pressure of 10 MPa or more is required. In other words, alcohol used as a rinse solution can be replaced with/exhausted by the use of supercritical carbon dioxide of 10 MPa or more. However, as described previously, when supercritical carbon dioxide of 10 MPa or more is used, moisture is absorbed in the supercritical carbon dioxide to produce the cause of pattern swelling. This moisture in patterns can be expelled, after the processing using this high-pressure supercritical carbon dioxide, by replacing it with low-pressure supercritical carbon dioxide having a pressure close to the critical point.

This will be explained by taking actual pattern formation as an example.

First, a thin film of an electron-beam resist (ZEP-520) was formed on a substrate. A desired region was irradiated with (exposed to) an electron beam and developed at room temperature (23° C.) with hexyl acetate to form a resist pattern layer. Subsequently, the substrate was rinsed with ethanol.

Immediately after that, this substrate on which the resist pattern layer was formed was held in a reaction chamber. The internal temperature of this reaction chamber was set at 35° C., and 12-MPa supercritical carbon dioxide was supplied by pressure into the reaction chamber by a pump, thereby replacing/exhausting the ethanol as a rinse solution sticking to the surfaces of the substrate.

After that, 7.5-MPa supercritical carbon dioxide was introduced into the reaction chamber and kept supplied for 20 min while the internal pressure of the reaction chamber was held at 7.5 MPa.

Finally, the pressure of the supercritical carbon dioxide in the reaction chamber was reduced at a rate of 0.4 MPa/min to dry the substrate.

Consequently, a resist pattern layer in which fine patterns were formed was formed on the substrate in a good condition without any pattern bending or pattern swelling.

Fifth Embodiment

The fifth embodiment of the present invention will be described below.

The problem of supercritical carbon dioxide as a nonpolar supercritical fluid described in the above fourth embodiment can be solved by the use of supercritical states of polar substances presented below.

| Polar substance | Critical temperature (° C.) | Critical pressure (MPa) |
|---|---|---|
| $N_2O$ | 36.5 | 7.3 |
| $SO_4$ | 157.2 | 7.9 |
| $CCLF_3$ | 28.8 | 4.0 |
| $CHF_3$ | 25.9 | 4.8 |

Since these substances are polar molecules, they well mix with polar solvents such as alcohol and also have compatibility with water.

Accordingly, a rinse solution can be efficiently replaced by the use of any of these polar-molecule supercritical fluids. After replacing the rinse solution, the substrate can be dried by reducing the pressure of this supercritical fluid to the atmospheric pressure. However, if the resist used dissolves in this polar supercritical fluid, the polar critical fluid can be used in the form of a mixture with carbon dioxide. If this is the case, when the rinse solution is completely replaced the mixture is switched to the supercritical carbon dioxide alone, and the substrate is dried by reducing the pressure of this supercritical carbon dioxide to the atmospheric pressure.

Figure 15:
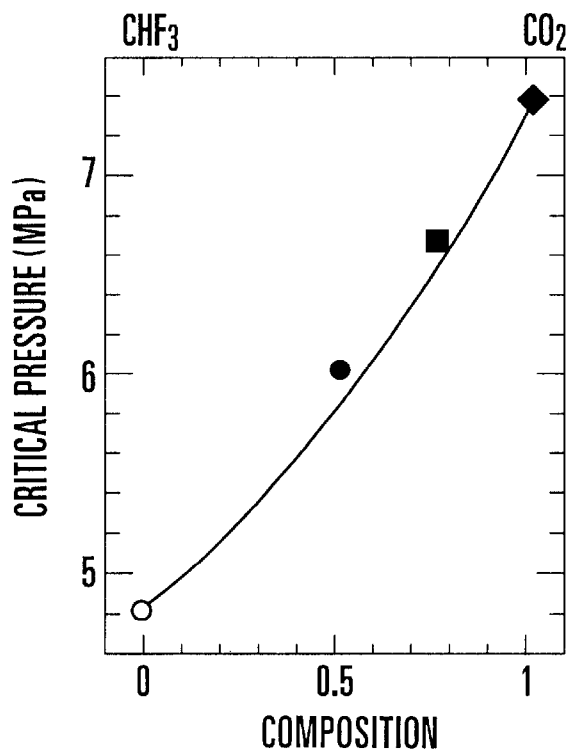
FIG. 15 is a graph showing the relationship between the composition ratio of carbon dioxide and CHF and the critical pressure.
Figure 16:
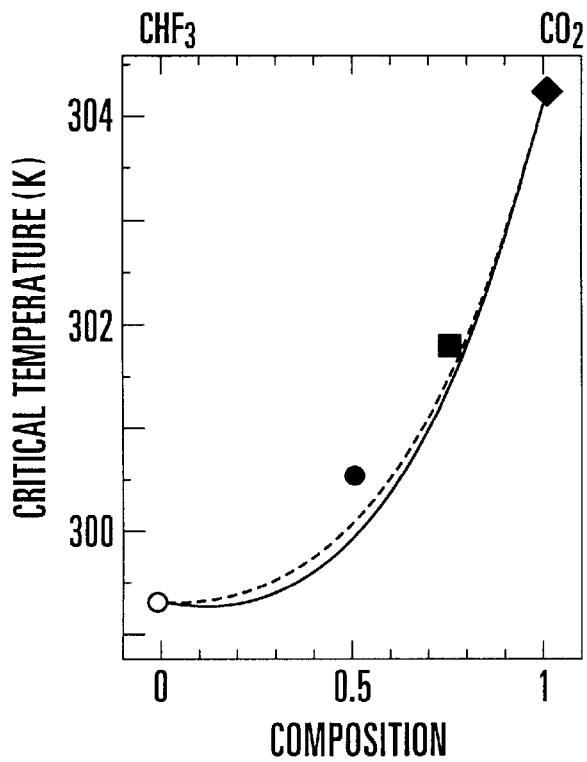
FIG. 16 is a graph showing the relationship between the composition ratio of carbon dioxide and CHF and the critical temperature.
Figure 17:
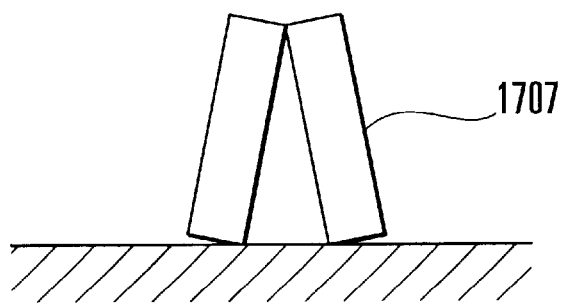
FIG. 17 is a sectional view showing the state of pattern bending of fine patterns.
Figure 18:
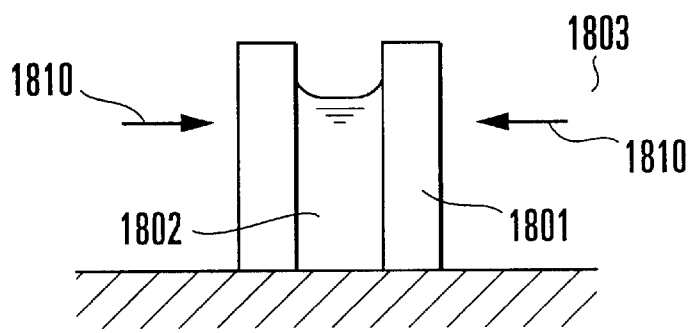
FIG. 18 is a sectional view showing the state in which a rinse solution exists between fine patterns.
Figure 19:
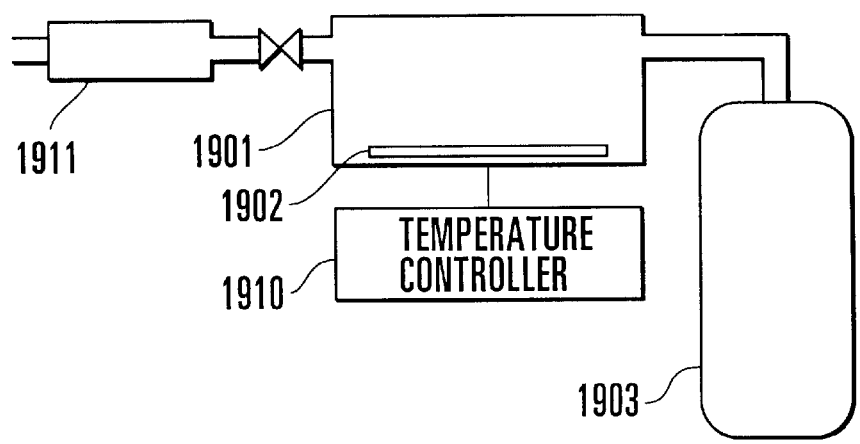
FIG. 19 is a sectional view showing an outline of the arrangement of a conventional supercritical drying apparatus.
Figure 20:
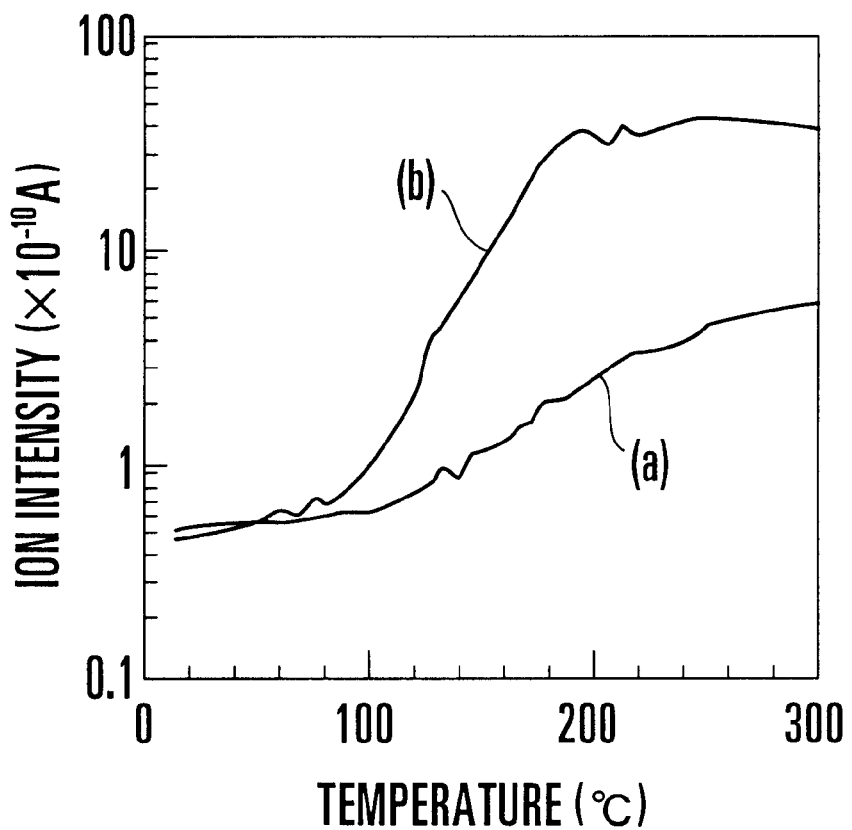
FIG. 20 is a graph showing the results of analyses of gases of molecules (water molecules) having a mass number of 18 released from a thin resist film.

FIG. 15 shows the relationship between the composition ratio and the supercritical pressure when supercritical $CHF_3$ and supercritical carbon dioxide were mixed. FIG. 16 shows the relationship between the composition ratio and the supercritical temperature when supercritical $CHF_3$ and supercritical carbon dioxide were mixed. FIGS. 15 and 16 imply that the critical pressure and the critical temperature continuously change with the composition ratio. Therefore, the supercritical state can be generated with no problem by mixing these polar molecules with carbon dioxide.

This will be described below by taking actual pattern formation as an example.

First, a thin film of an electron-beam resist (SAL-610) was formed on a substrate. A desired region was irradiated with (exposed to) an electron beam and developed at room temperature (23° C.) with an aqueous tetramethylammoniumhydroxide solution to form a resist pattern layer. Subsequently, the substrate was rinsed (washed) with water.

Immediately after that, this substrate on which the resist pattern layer was formed was held in a reaction chamber. The internal temperature and internal pressure of this reaction chamber were set at 30° C. and 10 MPa, respectively. In this state, a supercritical fluid that was $N_2O$:carbon dioxide=1:1 was supplied by pressure into the reaction chamber by a pump to replace/exhaust ethanol as a rinse solution sticking to the surfaces of the substrate. Subsequently, the internal temperature of the reaction chamber was gradually raised to 35° C., and the supercritical fluid to be supplied was switched to supercritical carbon dioxide alone. This supercritical carbon dioxide was supplied for 10 min while the internal pressure of the reaction chamber was held at 7.5 MPa. After that, the pressure of the supercritical carbon dioxide in the reaction chamber was reduced at a rate of 0.4 MPa/min to dry the substrate.

Consequently, a resist pattern layer in which fine patterns were formed was formed on the substrate in a good condition without any pattern bending or pattern swelling.

Sixth Embodiment

The sixth embodiment of the present invention will be described below.

In the above fifth embodiment, rinse solutions were replaced with polar supercritical fluids. However, these polar supercritical fluids can be directly used in development. For example, in a positive resist the molecular weight of an exposed region lowers. A polar supercritical fluid can dissolve this low-molecular-weight exposed region. Since an unexposed region is left behind without being dissolved, a resist pattern layer can be formed.

When this polar supercritical fluid is replaced with a nonpolar supercritical fluid such as carbon dioxide after that, this nonpolar supercritical fluid functions as a rinse solution. After that, the substrate can be dried with no pattern bending by vaporizing the nonpolar fluid by reducing its pressure. Also, if rinsing is done with a nonpolar fluid having a pressure close to the critical point, no pattern swelling occurs.

This will be described below by taking actual pattern formation as an example.

First, a thin film of an electron-beam resist (PMMA) was formed on a substrate, and a desired region was irradiated with (exposed to) an electron beam. The substrate was held in a reaction chamber at 35° C. The internal pressure of this closed reaction chamber was set at 10 MPa, and a $CHF_3$ supercritical fluid was supplied by pressure into the reaction chamber by a pump to develop the resist film formed on the substrate. After that, the supercritical fluid was switched to supercritical carbon dioxide, and this supercritical carbon dioxide was supplied to the reaction chamber for 10 min while the internal pressure of the reaction chamber was held at 7.5 MPa. The substrate was then dried by reducing the pressure of the supercritical carbon dioxide in the reaction chamber at a rate of 0.4 MPa/min.

Consequently, a resist pattern layer in which fine patterns were formed was formed on the substrate in a good condition without any pattern bending or pattern swelling.

In the above first to sixth embodiments, electron-beam resists such as PMMA and ZEP-520 are used as resists. However, similar effects can be obtained when resists, such as an X-ray resist, made from organic materials are used. Also, in the above first to sixth embodiments alcohols and water are used as rinse solutions. However, rinse solutions are not restricted to these materials. Although each embodiment uses a supercritical fluid having a zero surface tension, it is only necessary to use a substantially critical fluid (substance). If a fluid to be used is substantially supercritical, its surface tension is substantially zero, so effects similar to those explained in the above embodiments can be obtained. For example, while pressure is being controlled to be close to the critical point, it is difficult to just exceed the critical temperature and the critical pressure at any instant; during the control, a state below the critical point partially exists. However, even if this state below the critical point partially exists, the surface tension of even this portion is substantially zero. So, this portion can also be said to be a substantially supercritical fluid.

As has been described above, in a pattern formation method of the present invention, a resist pattern layer having a predetermined pattern is formed from a resist film of an organic material formed on a substrate. A rinse process is performed by exposing the resist pattern layer to a rinse solution. Before the rinse solution sticking to the resist pattern layer dries out, the resist pattern layer is exposed to supercritical carbon dioxide having a pressure of 8.5 MPa or less. After that, the supercritical carbon dioxide is vaporized by lowering the pressure of the ambient of the substrate.

This arrangement suppresses the entrance of moisture into the resist pattern layer exposed to the supercritical carbon dioxide. Consequently, the present invention can effectively form, by using a supercritical fluid, a resist pattern layer in which fine patterns are accurately formed without any pattern bending or pattern swelling.

A pattern formation apparatus of the present invention comprises a closable reaction chamber in which a substrate to be processed is placed, supply means for supplying supercritical carbon dioxide into the reaction chamber, pressure control means for controlling the internal pressure of the reaction chamber, and temperature control means for controlling the internal temperature of the reaction chamber.

With this arrangement, carbon dioxide already made supercritical is supplied into the reaction chamber. This suppresses the production of moisture due to condensation in the reaction chamber. Also, since the pressure control means controls the pressure of this supercritical carbon dioxide, the entrance of moisture into the organic substance resist pattern layer is suppressed. Consequently, the present invention can effectively form, by using a supercritical fluid, a resist pattern layer in which fine patterns are accurately formed without any pattern bending or pattern swelling.

In another pattern formation method of the present invention, a resist pattern layer having a predetermined pattern is formed from a resist film of an organic material formed on a substrate. A rinse process is performed by exposing the resist pattern layer to a rinse solution. Before the rinse solution sticking to the resist pattern layer dries out, the resist pattern layer is exposed to a processing fluid not in gaseous state and having a predetermined density higher than in gaseous state or more. This processing fluid is a gas in steady state. Subsequently, the resist pattern layer is exposed to a supercritical fluid. After that, the supercritical fluid is vaporized by lowering the pressure of the ambient of the substrate.

With this arrangement, the rinse solution is replaced by the processing fluid and removed from the resist pattern layer. Also, the processing fluid is replaced by the supercritical fluid and removed from the resist pattern layer. That is, at the stage of the supercritical fluid processing, no rinse solution sticks to the resist pattern layer, so the entrance of moisture into the organic substance resist pattern layer is suppressed. Consequently, the present invention can effectively form, by using a supercritical fluid, a resist pattern layer in which fine patterns are accurately formed without any pattern bending or pattern swelling.

Another pattern formation apparatus of the present invention comprises a closable reaction chamber in which a substrate to be processed is placed, first supply means for supplying, into the reaction chamber, a processing fluid not in gaseous state and having a predetermined density higher than in gaseous state or more, second supply means for supplying a supercritical fluid into the reaction chamber, pressure control means for controlling the internal pressure of the reaction chamber, and temperature control means for controlling the internal temperature of the reaction chamber, wherein the processing fluid is a gas in steady state.

With this arrangement, the processing fluid not in gaseous state and having a density higher than in gaseous state and the supercritical fluid are not generated in but supplied into the reaction chamber. This suppresses the production of moisture due to condensation in the reaction chamber. Also, since the pressure control means controls the pressure of this supercritical carbon dioxide, the entrance of moisture into the organic substance resist pattern layer is suppressed. Consequently, the present invention can effectively form, by using a supercritical fluid, a resist pattern layer in which fine patterns are accurately formed without any pattern bending or pattern swelling.

In still another formation method of the present invention, a resist film of an organic material formed on a substrate is exposed. A solvent having developing properties is added to a processing fluid not in gaseous state and having a density higher than in gaseous state, a density at which the solvent homogeneously mixes or more is set, and the exposed resist film is developed by exposing it to the processing fluid, thereby forming a resist pattern layer having a predetermined pattern on the substrate. This processing fluid is a gas in steady state. The resist pattern layer is exposed to a supercritical fluid having a pressure equal to or less than the pressure of the processing fluid. After that, the supercritical fluid is vaporized by lowering the pressure of the ambient of the substrate.

With this arrangement, after development is performed by the solvent contained in the processing fluid, this processing fluid is replaced by the supercritical fluid and removed from the resist pattern layer. In this way, development is stopped. That is, at the stage of the rinse process, only the supercritical fluid sticks to the resist pattern layer, so the entrance of moisture into the organic substance resist pattern layer is suppressed. Consequently, the present invention can effectively form, by using a supercritical fluid, a resist pattern layer in which fine patterns are accurately formed without any pattern bending or pattern swelling.

In still another pattern formation method of the present invention, a resist film of an organic material formed on a substrate is exposed. The exposed resist film is developed by exposing it to a polar processing fluid not in gaseous state and having a density higher than in gaseous state, thereby forming a resist pattern layer having a predetermined pattern. This processing fluid is a gas in steady state. The resist pattern is then exposed to a supercritical fluid. After that, the supercritical fluid is vaporized by lowering the pressure of the ambient of the substrate.

With this arrangement, after development is performed using the polar processing fluid, this processing fluid is replaced by the supercritical fluid and removed from the resist pattern layer. In this manner, development is stopped. That is, at the stage of the rinse process, only the supercritical fluid sticks to the resist pattern layer, so the entrance of moisture into the organic substance resist pattern layer is suppressed. Consequently, the present invention can effectively form, by using a supercritical fluid, a resist pattern layer in which fine patterns are accurately formed without any pattern bending or pattern swelling.

What is claimed is:

1. A pattern formation method comprising the steps of:
   forming a resist pattern layer having a predetermined pattern from a resist film of an organic material formed on a substrate;
   performing a rinse process by exposing said resist pattern layer to a rinse solution;
   supplying supercritical carbon dioxide having a pressure of not more than 8.5 MPa to an ambient of said substrate, after the rinse process and before the rinse solution sticking to said resist pattern layer dries out, thereby exposing said resist pattern layer to said supercritical carbon dioxide; and
   vaporizing said supercritical carbon dioxide by lowering a pressure of the ambient of said substrate.

2. A method according to claim 1, wherein said supercritical carbon dioxide is used at a pressure of not more than 8 MPa.

3. A pattern formation method comprising:
   the first step of forming a resist pattern layer having a predetermined pattern from a resist film of an organic material formed on a substrate;
   the second step of performing a rinse process by exposing said resist pattern layer to a rinse solution;
   the third step of supplying, to an ambient of said substrate, a processing fluid not in gaseous state and having not less than a predetermined density higher than in gaseous state, before the rinse solution sticking to said resist pattern layer dries, thereby exposing said resist pattern layer to said processing fluid;
   the fourth step of subsequently supplying a supercritical fluid to the ambient of said substrate to expose said resist pattern layer to said supercritical fluid; and
   the fifth step of vaporizing said supercritical fluid by lowering a pressure of the ambient of said substrate, wherein said processing fluid is a gas in steady state.

4. A method according to claim 3, wherein
   liquefied carbon dioxide is used as said processing fluid, and
   supercritical carbon dioxide is used as said supercritical fluid.

5. A method according to claim 3, wherein
   a high-pressure supercritical fluid having not less than a predetermined pressure is used as said processing fluid, and
   in the fourth step a supercritical fluid whose pressure is lower than the pressure of said high-pressure supercritical fluid is used.

6. A method according to claim 5, wherein
   said high-pressure supercritical fluid has a density of not less than 0.7 g/cm$^3$, and
   in the fourth step said resist pattern is exposed to a supercritical fluid having a pressure of not more than 8.5 MPa.

7. A method according to claim 3, wherein a polar supercritical fluid is used as said processing fluid.

8. A pattern formation method comprising:
   the first step of exposing a resist film of an organic material formed on a substrate;
   the second step of adding a solvent having developing properties to a processing fluid not in gaseous state and having a density higher than in gaseous state, setting not less than a density at which said solvent uniformly mixes, and performing development by exposing said exposed resist film to said processing fluid, thereby forming a resist pattern layer having a predetermined pattern;
   the third step of supplying a supercritical fluid having a pressure not more than a pressure of said processing fluid to an ambient of said substrate, thereby exposing said resist pattern layer to said supercritical fluid; and
   the fourth step of vaporizing said supercritical fluid by lowering a pressure of the ambient of said substrate, wherein said processing fluid is a gas in steady state.

9. A method according to claim 8, wherein liquefied carbon dioxide having a density of not less than 0.7 g/cm$^3$ is used as said processing fluid.

10. A method according to claim 8, wherein supercritical carbon dioxide having a density of not less than 0.7 g/cm$^3$ is used as said processing fluid.

11. A pattern formation method comprising:
    the first step of exposing a resist film of an organic material formed on a substrate;
    the second step of performing development by exposing said exposed resist film to a processing fluid not in gaseous state and having a density higher than in gaseous state, thereby forming a resist pattern layer having a predetermined pattern;
    the third step of supplying a supercritical fluid to an ambient of said substrate to expose said resist pattern layer to said supercritical fluid; and
    the fourth step of vaporizing said supercritical fluid by lowering a pressure of the ambient of said substrate, wherein said processing fluid is a gas in steady state.

12. A method according to claim 11, wherein said processing fluid is a polar supercritical fluid.

13. A method according to claim 12, wherein in the second step, supercritical carbon dioxide is added to said polar supercritical fluid.

* * * * *